(12) United States Patent
Suyama et al.

(10) Patent No.: US 6,574,150 B2
(45) Date of Patent: Jun. 3, 2003

(54) DYNAMIC RANDOM ACCESS MEMORY WITH LOW POWER CONSUMPTION

(75) Inventors: Junichi Suyama, Tokyo (JP); Wataru Nagai, Tokyo (JP); Akihiro Hirota, Tokyo (JP); Shota Ohtsubo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/175,859

(22) Filed: Jun. 21, 2002

(65) Prior Publication Data

US 2002/0163847 A1 Nov. 7, 2002

Related U.S. Application Data

(62) Division of application No. 09/907,449, filed on Jul. 18, 2001, now Pat. No. 6,438,061.

(30) Foreign Application Priority Data

Jul. 19, 2000 (JP) ........................................ 2000/219279

(51) Int. Cl.[7] ................................................. G11C 7/00
(52) U.S. Cl. .................................. 365/189.05; 365/227
(58) Field of Search ................................. 365/226, 227, 365/228, 189.05

(56) References Cited

U.S. PATENT DOCUMENTS

| | | | | |
|---|---|---|---|---|
| 5,583,457 A | * | 12/1996 | Horiguchi et al. | 326/121 |
| 6,232,793 B1 | * | 5/2001 | Arimoto et al. | 326/34 |
| 6,333,895 B1 | | 12/2001 | Hamamoto et al. | 365/233 |
| 6,335,895 B1 | | 1/2002 | Sugibayashi | 365/227 |
| 2001/0043095 A1 | | 5/2001 | Taniguchi | 327/112 |

* cited by examiner

Primary Examiner—Son Mai
(74) Attorney, Agent, or Firm—Volentine Francos PLLC

(57) ABSTRACT

A low power consumption type dynamic random access memory (DRAM) operable with reduced current consumption responsive to an external signal, without causing occurrence of malfunction during low current consumption. An input circuit for receiving signals, a memory array for holding data, and a peripheral circuit for controlling the memory array are driven by an internal voltage supplied by two groups of internal voltage receiving circuits, while an output circuit for outputting signals is driven by an external power supply. The two groups of internal voltage receiving circuits are deactivated in response to an externally provided power supply control signal, and the output circuit is controlled so as to be in a high impedance condition with voltage of the external power supply being applied thereto.

13 Claims, 3 Drawing Sheets

DYNAMIC RANDOM ACCESS MEMORY WITH LOW POWER CONSUMPTION

CROSS-REFERENCE TO RELATED APPLICATIONS

This is a divisional of application Ser. No. 09/907,449, filed Jul. 18, 2001 now U.S. Pat. No. 6,438,061, which is incorporated herein by reference in its entirety.

BACKGROUND OF THE INVENTION

The present invention relates to dynamic random access memories with reduced power consumption, and in particular, to a low power consumption type suitable for use in a cellular phone or the like.

Because a dynamic random access memory (referred to hereinafter as a DRAM) is provided with memory cells made up of a transistor and a capacitor, the DRAM can be highly integrated. Accordingly, its price is lower in comparison with other random access memories, particularly a static random access memory (referred to hereinafter as a SRAM).

Meanwhile, current consumption of the SRAM is lower in comparison with that of the DRAM, and in particular, current consumption of the SRAM at standby times when read/write are not performed is markedly lower in comparison with that for the DRAM. One of reasons for this is that the DRAM performs refresh operation during standby to hold data.

The DRAM is usually driven by a power supply from outside (an external power supply), and when supply of power from the external power supply is cut off, data held in the DRAM are erased. This is because the refresh operation described above can not be performed, so that stored data can not be held. Further, internal circuits of the DRAM are not driven by direct use of the external power supply, but usually voltage of the external power supply is converted into internal voltage through an internal voltage generation circuit, thereby driving respective circuits with the internal voltage.

The DRAM described above is useful in equipment such as a personal computer with constant supply of voltage from an external power supply, but not suitable for use in a device such as a cellular phone, and so forth, of which low current consumption is required. Accordingly, a conventional cellular phone has a memory configuration wherein a controller 20, a SRAM 30, and a flash memory 40 are connected to a data bus 10 in common, as shown in FIG. 2, and voltage from a power supply 50 is supplied to these components all the time.

There has recently been seen a trend of the cellular phone transmitting and receiving not only voice but also massive data such as character information, picture data, and so forth. The DRAM has a large storage capacity, however, it consumes current by performing refresh operation, and usually has a circuit configuration comprising a circuit for generating an internal potential, wherein current is constantly consumed. For this reason, the DRAM is unsuitable for use in the device such as the cellular phone, and so forth, of which low current consumption is required. As described above, the conventional cellular phone has the memory configuration wherein the controller 20, the SRAM 30, and the flash memory 40 are connected to the data bus 10 in common, as shown in FIG. 2, and the voltage from the power supply 50 is supplied to these components all the time.

As described in the foregoing, since the DRAM has large current consumption, it is necessary to hold down current consumption thereof when put to use in the cellular phone. Accordingly, adoption of a configuration as shown in FIG. 3 is conceivable in case of using the DRAM in the cellular phone. More specifically, as with the SRAM 30, and the flash memory 40, a DRAM 60 is connected to the data bus 10, however, a switch 70 is provided between the power supply 50 and the DRAM 60. The controller 20 makes a decision on necessity of using the DRAM 60, and holds down current consumption in the DRAM 60 by cutting off supply of voltage from the power supply 50 with the flick of the switch 70 (by tuning off the switch 70) when a negative decision is made.

With the configuration shown in FIG. 3, however, there will arise problems that (1) an external element such as the switch 70 is required, and (2) there is a possibility of the DRAM 60 undergoing malfunction due to flow-in of current from the data bus 10 through a parasitic diode when supply of power from the power supply 50 to the DRAM 60 is cut off. The problem (2) of these problems will be described in detail hereinafter with reference to FIG. 4.

To take an example wherein the final stage of an output circuit of the DRAM 60 is an inverter, an inverter 100 is made up of an NMOS transistor 110 and a PMOS transistor 120 as shown in FIG. 4. The gate of the NMOS transistor 110 and the gate of the PMOS transistor 120 are connected to an input node 150 in common. In the case of the output circuit, the input node 150 receives an output signal from the DRAM 60. The source S of the PMOS transistor 120 is provided with a power supply potential. The drain D of the PMOS transistor 120 and the drain of the NMOS transistor 110 are connected to an output node 140 in common. The output node 140 is connected to an output terminal of the DRAM 60, and to the data bus 10 as shown in FIG. 3 in the case where the DRAM 60 is mounted in the cellular phone, or the like. The source of the NMOS transistor 110 is provided with the ground potential.

Herein, in the PMOS transistor 120, there is formed a parasitic diode 130 forward biased from the drain D of the PMOS transistor 120 to the source S thereof. When supply of power is cut off, and voltage is no longer supplied to the source S of the PMOS transistor 120, the source S of the PMOS transistor 120 is not provided with the power supply potential. Meanwhile, when a signal at a high (H) level is sent to the data bus 10, the signal at the H level is given to the drain D of the PMOS transistor 120 because the DRAM 60 is connected to the data bus 10. Consequently, the H level signal is given to the source S of the PMOS transistor 120 via the parasitic diode 130. Because the source S of the PMOS transistor 120 is connected to other circuits via a power supply line, it follows that the other circuits are supplied with a potential. Further, with reference to data on the data bus, there is a possibility of the level of the H level signal being lowered to a low (L) level.

SUMMARY OF THE INVENTION

The invention has been developed to solve the problems described above, and it is an object of the invention to provide a low power consumption type dynamic random access memory (DRAM) with reduced current consumption in the DRAM by a signal from outside, and without causing occurrence of malfunction at times of low current consumption.

A low power consumption type dynamic random access memory according to the invention comprises internal voltage receiving circuits driven by an external power supply, for generating internal voltages, an input circuit for receiving signals, a memory array for holding data, a peripheral circuit for controlling the memory array, and an output circuit for outputting signals, wherein the output circuit is driven by the external power supply while the input circuit, the memory array, and the peripheral circuit are driven by the internal voltages generated by the internal voltage receiving circuits, respectively, and the internal voltage receiving circuits are deactivated in response to a control signal inputted from outside, the output circuit being controlled so as to be in a high impedance condition with the voltage of the external power supply being applied thereto.

DETAILED DESCRIPTION OF THE PREFERRED EMBODIMENT

Figure 1:
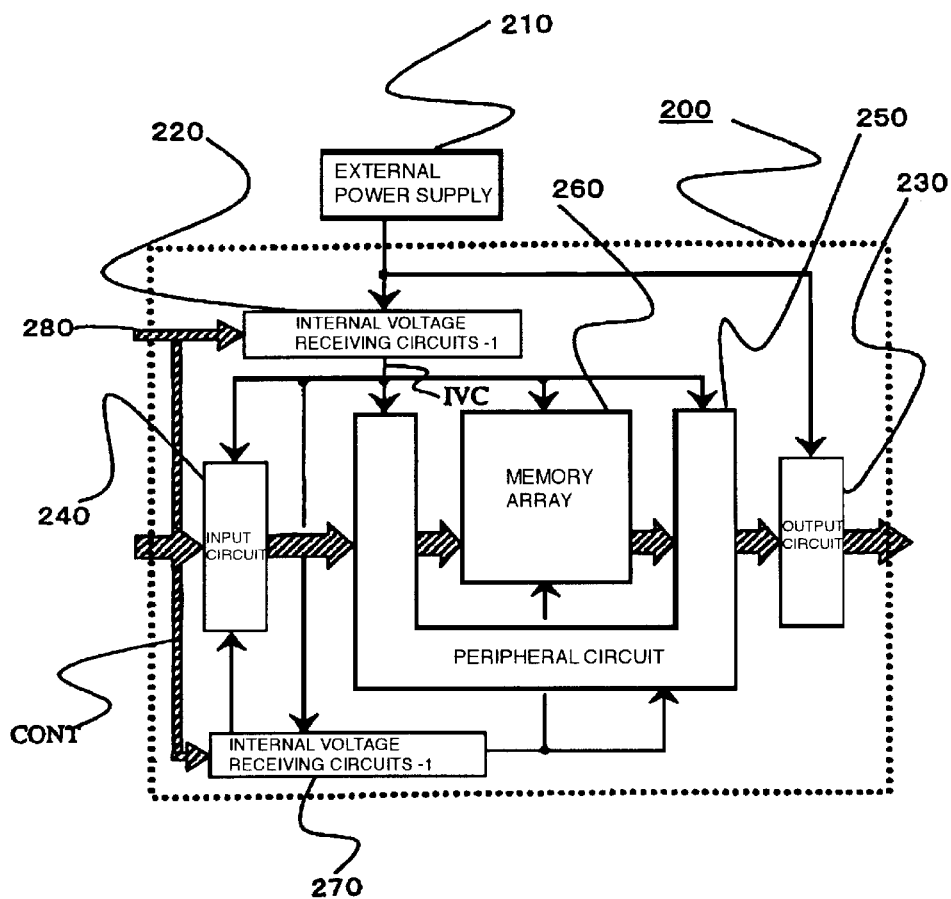
FIG. 1 is a block diagram of an embodiment of a DRAM according to the invention.
Figure 2:
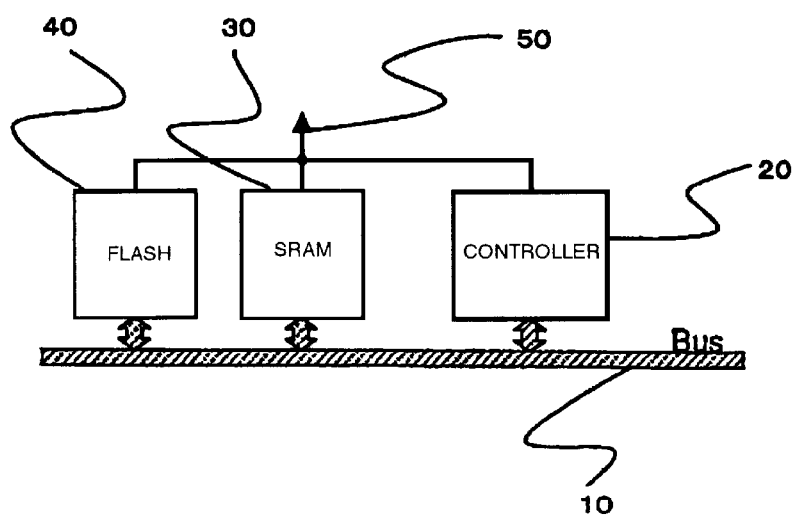
FIG. 2 is a schematic illustration showing a memory configuration of a conventional cellular phone.
Figure 3:
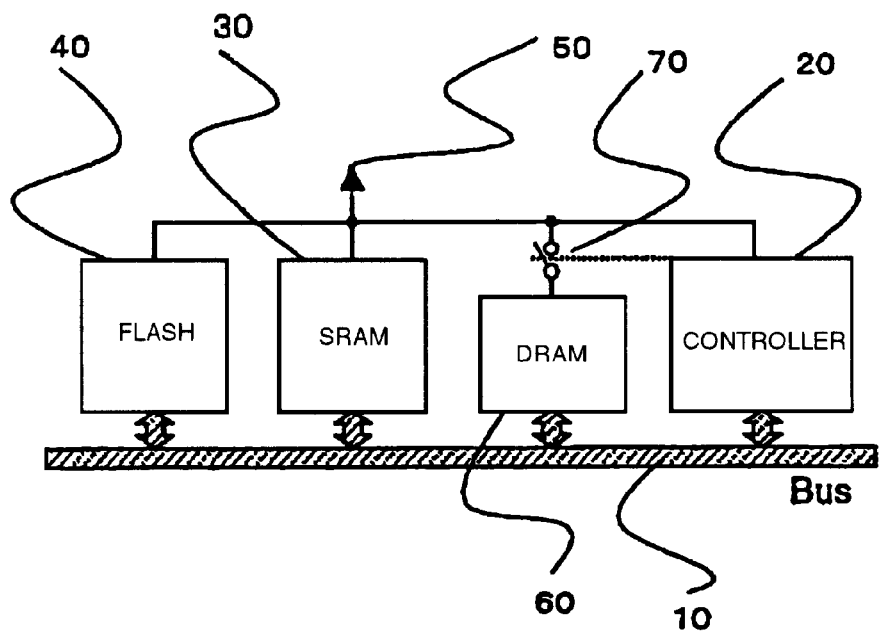
FIG. 3 is a schematic illustration showing a memory configuration of the conventional cellular phone wherein a conventional DRAM is used.

FIG. 1 is a block diagram of an embodiment of a DRAM according to the invention. A DRAM 200 is driven by an external power supply 210. Accordingly, a memory configuration of a cellular phone is in the same condition as a condition wherein the DRAM 60 in FIG. 3 is directly connected to the power supply 50 without the switch 70 interposed therebetween. That is, in the same condition wherein the DRAM 60 is connected to the power supply as with the SRAM 30, and the flash memory 40 in FIG. 3.

The external power supply 210 is connected to a first internal voltage receiving circuits 220 as well as an output circuit 230. The first internal voltage receiving circuits 220 include an internal voltage generator and a plurality of functional circuits connected to the internal voltage generator. The internal voltage generator is driven by the external voltage supply 210. The internal voltage generator converts a potential received from the external power supply 210 into an internal voltage IVC. The functional circuits are driven by the internal voltage IVC. The internal voltage IVC is supplied to an input circuit 240, a peripheral circuit 250, a memory array 260, and a second internal voltage receiving circuits 270. For example, the external power supply 210 is at 3.3V, and the internal voltage IVC is 2.4V.

The first internal voltage receiving circuits 220 receives a power supply control signal CONT via a control terminal 280, and is deactivated by the power supply control signal CONT. Accordingly, the internal voltage IVC is not supplied to the input circuit 240, the peripheral circuit 250, the memory array 260, and the second internal voltage receiving circuits 270 by the first internal voltage receiving circuits 220. That is, by virtue of the power supply control signal CONT, current consumption within the first internal voltage receiving circuits 220 is completely eliminated.

In this connection, there are two conceivable cases of eliminating current consumption within the first internal voltage receiving circuits 220, namely, a case of rendering the internal voltage IVC to become 0V, and another case of matching the internal voltage IVC with the potential of the external power supply 210. There can be a case where a bit line is shorted to a word line in a part of the memory array 260, and such a faulty part is replaced with redundancy. In such a condition, if the internal voltage IVC is simply matched with the potential of the external power supply 210, flow of current at several micro A into a shorted part will occur. Accordingly, the internal voltage IVC is preferably rendered to be 0V (ground potential).

The second internal voltage receiving circuits 270 receives the internal voltage IVC from the first internal voltage receiving circuits 220, and the internal voltage IVC as received is converted into other internal voltages, which are supplied to the input circuit 240, the peripheral circuit 250, the memory array 260. In the other internal voltages, there are included a substrate potential, a booster potential, a ½ internal voltage, and a reference potential. For example, when the internal voltage is 2.4V, these potentials are at −1.0V as the substrate potential, at 3.6V as the booster potential, at 1.2V as the ½ internal voltage, and at 1.1V as the reference potential, respectively.

The second internal voltage receiving circuits 270 receives the power supply control signal CONT via the control terminal 280, and is deactivated by the power supply control signal CONT. Because the second internal voltage receiving circuits 270 has not received the internal voltage IVC from the first internal voltage receiving circuits 220 at this point in time, the second internal voltage receiving circuits 270 is substantially in a deactivated condition, and will be completely deactivated upon receipt of the power supply control signal CONT. Accordingly, the internal voltage IVC is not supplied to the input circuit 240, the peripheral circuit 250, and the memory array 260 by the second internal voltage receiving circuits 270. That is, by virtue of the power supply control signal CONT, current consumption within the second internal voltage receiving circuits 270 is completely eliminated.

The input circuit 240 is usually connected to a data bus in order to receive signals. That is, in the case where the DRAM is mounted in a cellular phone, or the like, the DRAM is connected to a data bus 10 as shown in FIG. 3. Consequently, a signal is sent out to the peripheral circuit 250 in response to data from outside (for example, data on the data bus 10) provided that voltage is applied to the input circuit 240.

Figure 4:
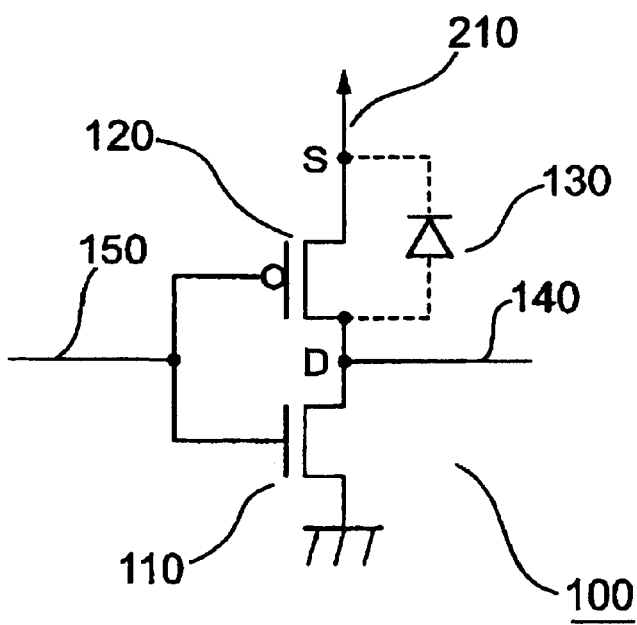
FIG. 4 is a circuit diagram showing a typical inverter serving as an input circuit as well as an output circuit of the embodiment of the DRAM according to the invention.

As a typical example of the input circuit 240, there is cited an inverter 100 as shown in FIG. 4. Herein an input node 150 of the inverter 100 is connected to the data bus while an output node 140 is connected to the peripheral circuit 250, and so forth.

In case the internal voltage IVC is turned to 0V as a result of the first internal voltage receiving circuits 220 being deactivated, the source S of a PMOS transistor 120 is no longer provided with a power supply potential, so that current consumption is completely eliminated. Further, a signal is sent out from the data bus to the input node 150, however, since no potential is given to the source of an NMOS transistor 110 as well as the PMOS transistor 120, current consumption does not occur nor are circuits within the DRAM affected.

Further, in case the internal voltage IVC being at a potential identical to that of the external power supply as a result of the first internal voltage receiving circuits 220 being deactivated, there is a possibility that a signal is sent out from the data bus to the input node 150, thereby causing the DRAM to start operation. Hence, the input circuit 240 is preferably deactivated by the agency of the power supply control signal CONT inputted via the control terminal 280.

The peripheral circuit 250 receives data from the input circuit 240, and delivers the data to the memory array 260, and also receives the data from the memory array 260, sending out the data to the output circuit 230. Further, the peripheral circuit 250 includes various circuits such as a circuit for controlling the memory array 260, and so forth. The peripheral circuit 250 does not perform direct exchange of data with the outside of the DRAM, and consequently, comes into a deactivated condition without causing current consumption to occur when the first internal voltage receiving circuits 220, the second internal voltage receiving circuits 270, and the input circuit 240 are deactivated.

In the case where the DRAM is a synchronous DRAM or a Rambus type DRAM, operationally necessary data such as CAS latency, a burst length, an output mode, and so forth are set to be programmable. Such information is usually stored in a mode register for storing operation control information. The mode register is provided inside the peripheral circuit 250 or in the vicinity thereof. With the DRAM having such a configuration, if supply of voltage to the peripheral circuit and so forth is stopped, the data stored is destroyed. Accordingly, it is conceivably to drive only the mode register by the external power supply.

Further, the memory array 260 does not perform direct exchange of data with the outside of the DRAM either, and consequently, comes into a deactivated condition without causing current consumption to occur when the first internal voltage receiving circuits 220, the second internal voltage receiving circuits 270, and the peripheral circuit 250 are deactivated.

The output circuit 230 is usually connected to the data bus in order to output data from the memory array. That is, in the case where the DRAM 200 is mounted in the cellular phone, or the like, the DRAM 200 is connected to the data bus 10 as shown in FIG. 3. Consequently, a signal is outputted to the data bus in response to the data delivered from inside the DRAM 200 (the data sent out from the peripheral circuit 250).

Figure 5:
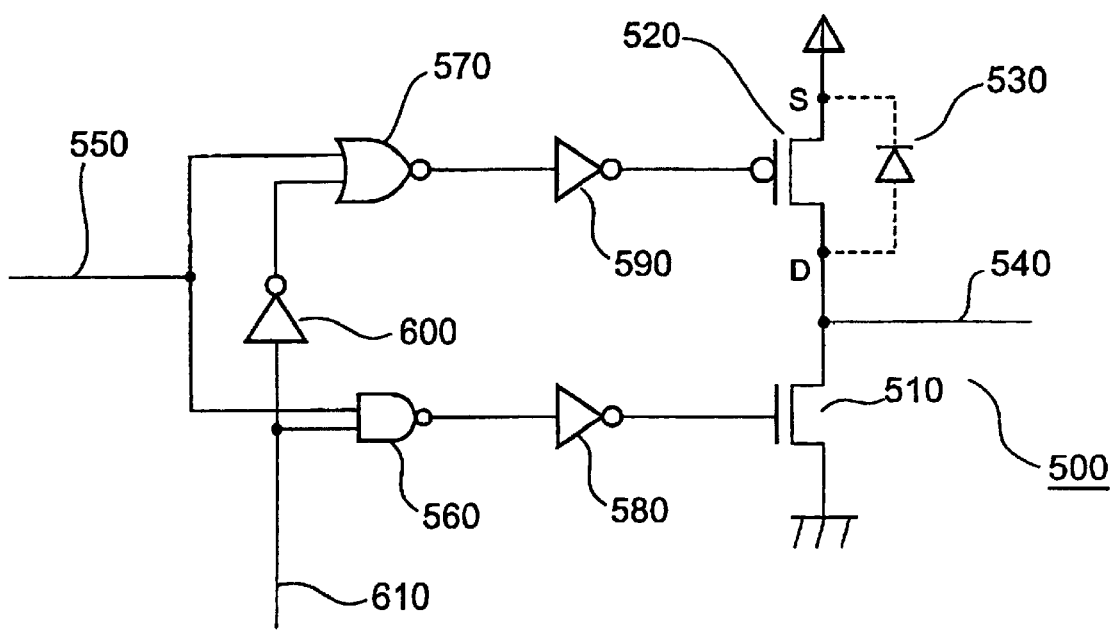
FIG. 5 is a circuit diagram showing a typical inverter serving as the output circuit of the embodiment of the DRAM according to the invention.

As a typical example of the output circuit 230, there is cited an inverter 500 shown in FIG. 5. The inverter 500 is comprised of an NMOS transistor 510, a PMOS transistor 520, a NAND circuit 560, a NOR circuit 570, a first inverter circuit 580, a second inverter circuit 590, and a third inverter circuit 600. The source of the NMOS transistor 510 is at the ground potential, and the drain thereof is connected to an output terminal 540. The source of the PMOS transistor 520 is at the potential of the power supply, and the drain thereof is connected to an output terminal 540. An input terminal 550 of the inverter 500 is connected to a first input terminal of the NAND circuit 560 as well as a first input terminal of the NOR circuit 570.

The power supply control signal CONT is inputted from a control input terminal 610 of the inverter 500 to a second input terminal of the NAND circuit 560. The power supply control signal CONT is inverted by the third inverter circuit 600 before being inputted to a second input terminal of the NOR circuit 570 as well. An output of the NAND circuit 560 is connected to the gate of the NMOS transistor 510 via the first inverter circuit 580 while an output of the NOR circuit 570 is connected to the gate of the PMOS transistor 520 via the second inverter circuit 590.

Now, referring to FIGS. 1 and 3 as well, operation of the output circuit 230 is described hereinafter.

The input terminal 550 of the inverter 500 is connected to the peripheral circuit 250, and the output terminal 540 thereof is connected to the data bus 10 via an output terminal, and so forth, of the DRAM 200. It is to be pointed out herein that the output circuit 230 is provided with the potential of the external power supply 210. Since the DRAM 200 is always provided with the potential of the external power supply 210 (in the case where the DRAM 200 is mounted in a cellular phone, when the power supply of the cellular phone is in an ON condition, the DRAM 200 is always provided with the potential of the external power supply 210), the source S of the PMOS transistor 520 of the inverter 500 is at the potential of the power supply while the source of the NMOS transistor 510 thereof is at the ground potential.

When the power supply control signal CONT at a L level is inputted, the NAND circuit 560 outputs an output signal at a H level regardless of the level of a signal from the first input terminal thereof while the NOR circuit 570 outputs an output signal at an L level regardless of the level of a signal from the first input terminal thereof. These output signals are inverted by the first and second inverter circuits 580, 590, respectively, so that an L level signal is inputted to the gate of the NMOS transistor 510 and a H level signal is inputted to the gate of the PMOS transistor 520. Accordingly, the inverter 500 (the output circuit 230) is set such that an output condition thereof is of high impedance.

With the inverter 500 in such a condition, even if a signal at the H level or the L level is transferred to the data bus 10, there will occur no flow of current due to a parasitic diode 530 in the NMOS transistor 510 as well as the PMOS transistor 520 nor will the circuits within the DRAM be affected. Further, since the gate of the NMOS transistor 510 is provided with the L level signal while the gate of the PMOS transistor 520 is provided with the H level signal, the NMOS transistor 510 and the PMOS transistor 520 are kept in an OFF condition, so that current consumption does not occur.

With the embodiment described above, the example of the input circuit, wherein data are received by the gate of the transistors, is described hereinbefore, however, there are available an input protection transistor, and the like. In case current due to the parasitic diode is conceivable as described in the example of the output circuit, control in the input circuit as well may be implemented by applying the potential of the external power supply thereto so as not to turn the transistors ON as with the output circuit.

As described in the foregoing, according to the invention, there can be provided a low power consumption type dynamic random access memory (DRAM) with reduced current consumption in the DRAM and without causing occurrence of malfunction at times of low current consumption because, on one hand, the internal voltage receiving circuits, the input circuit, the memory array, and the peripheral circuit are deactivated by the power supply control signal from outside, and on the other hand, the output circuit is provided with the potential of the external power supply all the time.

What is claimed is:

1. A dynamic random access memory operated by an external power supply voltage, the dynamic random access memory comprising:
   an internal voltage circuit including an internal voltage generator for converting the external power supply voltage applied thereto into an internal power supply voltage;

an input circuit for receiving an input signal;

a memory array for storing data, said memory array being operated by the internal power supply voltage;

a peripheral circuit coupled to said memory array and said input circuit for controlling said memory array, said peripheral circuit being operated by the internal power supply voltage; and an output circuit coupled to said peripheral circuit for outputting an output signal, said output circuit being operated by the external power supply voltage;

wherein the output circuit is controlled to be in a high impedance condition while the internal voltage circuit is deactivated.

2. A dynamic random access memory as claimed in claim 1, wherein said input circuit is operated by the internal power supply voltage.

3. A dynamic random access memory as claimed in claim 1, wherein said input circuit is deactivated in response to a first control signal.

4. A dynamic random access memory as claimed in claim 1, further comprising a mode register for storing operation control information, said mode register being operated by the external power supply voltage.

5. A dynamic random access memory as claimed in claim 4, wherein the operation control information includes at least one of a latency for determining an output timing of a synchronous operation, a burst length, and an output mode.

6. A dynamic random access memory as claimed in claim 1, wherein the output circuit includes an output terminal, a PMOS transistor having a source connected to receive the external power supply voltage, a drain connected to the output terminal, and a gate, and an NMOS transistor having a source connected to receive a ground voltage, a drain connected to the output terminal, and a gate connected to the gate of the PMOS transistor.

7. A cellular phone including a dynamic random access memory and a controller, the dynamic access memory comprising:

an internal voltage circuit including an internal voltage generator for converting an external power supply voltage applied thereto into an internal power supply voltage;

an input circuit for receiving an input signal;

a memory array for storing data, said memory array being operated by the internal power supply voltage;

a peripheral circuit coupled to said memory array and said input circuit for controlling said memory array, said peripheral circuit being operated by the internal power supply voltage; and an output circuit coupled to said peripheral circuit for outputting an output signal, said output circuit being operated by the external power supply voltage;

wherein the output circuit is controlled to be in a high impedance condition while the internal voltage circuit is deactivated.

8. A cellular phone according to claim 7, wherein the controller outputs a control signal to the dynamic random access memory, wherein the output circuit is in the high impedance condition in response to the control signal, wherein the internal voltage circuit is deactivated in response to the control signal.

9. A cellular phone as claimed in claim 7, wherein said input circuit is operated by the internal power supply voltage.

10. A cellular phone as claimed in claim 7, wherein said input circuit is deactivated in response to a first control signal.

11. A cellular phone as claimed in claim 7, further comprising a mode register for storing operation control information, said mode register being operated by the external power supply voltage.

12. A cellular phone as claimed in claim 11, wherein the operation control information includes at least one of a latency for determining an output timing of a synchronous operation, a burst length, and an output mode.

13. A cellular phone as claimed in claim 7, wherein the output circuit includes an output terminal, a PMOS transistor having a source connected to receive the external power supply voltage, a drain connected to the output terminal, and a gate, and an NMOS transistor having a source connected to receive a ground voltage, a drain connected to the output terminal, and a gate connected to the gate of the PMOS transistor.

* * * * *